United States Patent [19]

Callahan

[11] Patent Number: 5,495,436
[45] Date of Patent: Feb. 27, 1996

[54] ANTI-FUSE ROM PROGRAMMING CIRCUIT

[75] Inventor: John M. Callahan, Fremont, Calif.

[73] Assignee: VLSI Technology, Inc., San Jose, Calif.

[21] Appl. No.: 372,087

[22] Filed: Jan. 13, 1995

[51] Int. Cl.$^6$ ................................................ G11C 17/00
[52] U.S. Cl. ........................... 365/96; 365/225.7; 327/536
[58] Field of Search .................................. 365/96, 225.7; 327/536

[56] References Cited

U.S. PATENT DOCUMENTS 5,397,939  3/1995  Gordon et al. ............................ 365/96

*Primary Examiner*—David C. Nelms
*Assistant Examiner*—F. Niranjan
*Attorney, Agent, or Firm*—Patrick T. King

[57]  ABSTRACT

A "charge-kicker" programming circuit for programming anti-fuse links in integrated-circuit memory devices permits smaller feature sizes and a correspondingly lower breakdown voltage by using reduced internal voltage levels to generate a gate voltage for a series pass transistor. A series pass transistor gates a high voltage programming signal (typically 13 volts) to a high-voltage programming line. Selection circuits steer the high voltage programming signal to various columns of anti-fuse elements. A fixed voltage, insufficient to turn on the series pass transistor is applied to the gate terminal of the series pass transistor. An alternating voltage is applied directly onto the gate terminal of the series pass transistor through a capacitor so that the peaks of the alternating voltage turn on the series pass transistor which gates the programming voltage to the main high voltage programming line for the anti-fuse memory array.

15 Claims, 4 Drawing Sheets

5,495,436

ANTI-FUSE ROM PROGRAMMING CIRCUIT

TECHNICAL FIELD

The present invention relates generally to circuits for programming integrated-circuit memory devices and, more particularly, to circuits for programming anti-fuse read only memory (ROM) devices.

BACKGROUND OF THE INVENTION

An anti-fuse ROM integrated-circuit device typically operates from a 5 volt power supply. In order to program the anti-fuse links for a typical anti-fuse ROM, a programming voltage of between 9.5 and 12.5 volts is required. Therefore, the programming circuitry within the ROM integrated-circuit device must be able to provide a minimum programming voltage of 12.5 volts to guarantee that all of the anti-fuse links of a ROM device are properly programmed. A typical external programming voltage applied to the ROM device is 13 volts. When the various memory cells of the ROM device are being programmed, the 13 volt programming voltage is switched within the ROM device to the various memory cells. The switching transistors require voltages higher than 1.25 volts to turn on the switching transistors.

In the prior art, charge pump circuits are very often provided on the ROM device to generate the higher voltages needed for operating the switching transistors. These charge-pump circuits internally produce voltages of 17 volts. These charge-pump circuits therefore require voltage levels which are 4 volts in excess of the 13 volt programming voltage applied to the anti-fuse links.

A problem may arise because of the junction breakdown voltage requirements for the ROM integrated-circuit device. Any internal voltages in the ROM integrated-circuit device must be kept below the junction voltage requirement to guarantee the integrity and performance of the integrated-circuit. Previously, breakdown voltage specifications were not a problem for a semiconductor integrated-circuit fabrication process which has, for example, a feature size of 1.0 micron because the breakdown voltage specification for such a fabrication process was 17 volts.

For newer semiconductor integrated-circuit fabrication processes which have, for example, feature sizes of 0.8 microns, the junction breakdown voltage specification is 16 volts. For a ROM device which uses charge-pump circuits, this means that the voltage at the top of an anti-fuse link cannot exceed 12.0 volts, which is i volts less than the 13 volt programming specification requirement. This problem will be much worse with fabrication processes which use 0.6 micron and smaller feature sizes because these fabrication processes have even lower junction breakdown voltages.

Therefore, the problem with programming of anti-fuse ROM devices with smaller and smaller feature sizes is how to accommodate the junction breakdown voltage requirement for a particular fabrication process while still providing the maximum voltage required to program an anti-fuse link. Thus, a need exists for programming circuitry for anti-fuse ROMS which operates with voltages below the breakdown voltages of their fabrication processes.

SUMMARY OF THE INVENTION

It is, therefore, an object of the present invention to provide programming circuitry for anti-fuse ROMS where the programming circuitry uses lower internal operating voltages to allow use of fabrication processes with smaller feature sizes.

In accordance with this and other objects of the invention, a "charge-kicker" programming circuit is provided for programming anti-fuse links in integrated-circuit memory devices. The "charge-kicker" programming circuit permits smaller feature sizes and a correspondingly lower breakdown voltage by using reduced internal voltage levels to generate a gate voltage for a series pass transistor. The series pass transistor gates a high voltage programming signal (typically 13 volts) to a high-voltage programming line. Selection circuits steer the high voltage programming signal to various columns of anti-fuse elements.

An advantage of the charge-kicker circuit according to the invention is that a single cycle or two of the oscillator signal is sufficient to charge the high-voltage programming line to the 13 volt level required to guarantee programming of the anti-fuse elements. Another advantage of the instant invention is that, instead of 17 volts being needed with a charge-pump to get 13 v on the main high voltage line, only 15 volts is needed according to the invention. The entire scheme can be used with other integrated-circuit processes having even smaller feature sizes in order to provide anti-fuse programming circuits which use lower internal voltages and avoid junction breakdown problems.

An on-chip programming circuit for programming anti-fuse elements of an integrated-circuit ROM includes a series pass transistor for directing a high voltage programming voltage to a high-voltage programming line for the anti-fuse elements. Means are included for providing a fixed voltage to the gate terminal of the series pass transistor, where the fixed voltage is insufficient to turn on the series pass transistor. Additional means are provided for directly superimposing an alternating voltage directly onto the gate terminal of the series pass transistor so that the peaks of the alternating voltage turn on the series pass transistor to cause the series pass transistor to turn on and apply the programming voltage to the main high voltage programming line for the anti-fuse memory array.

A capacitor provides for directly superimposing the alternating voltage directly onto the gate terminal of the series pass transistor. A saturating transistor connects the high voltage programming voltage to the gate terminal of the series pass transistor. The saturating transistor has a gate terminal which is connected to a voltage sufficient to saturate the saturating transistor.

Shunt transistors provide for shorting the gate terminal of the series pass transistor to a ground voltage and for shorting the source terminal of the series pass transistor to a ground voltage.

According to another aspect of the invention, an on-chip programming circuit for programming anti-fuse elements of an integrated-circuit ROM includes an input terminal at which is provided a programming voltage and an output terminal for gating the programming voltage to a main high voltage programming line for a number of memory cell columns. The on-chip programming circuit includes a first series transistor having a drain terminal connected to the input terminal of the programming circuit and having a source terminal connected to the output terminal of the programming circuit. A second saturated transistor has a drain terminal connected to the input terminal of the programming circuit, a source terminal connected to the gate terminal of the first series transistor, and a gate terminal to which is applied a positive voltage source so that the second saturated transistor remains in the saturated mode of operation. An oscillator input terminal is directly connected through a series capacitor to the oscillator input terminal and a second terminal gate terminal the series transistor;

An oscillator circuit is connected to the oscillator input terminal and provides an alternating voltage signal through the series capacitor directly to the gate terminal of the first series transistor. The oscillator provides a peak voltage sufficient to turn on the first series transistor so that the programming voltage is applied to the output terminal of the circuit voltage during the positive peaks of the oscillator voltage.

In one embodiment of the invention, the programming voltage is 13 volts and the output alternating voltage of the oscillator circuit is 6 volts peak.

A method for programming anti-fuse elements of an anti-fuse ROM, comprises the steps of: applying a programming voltage to the drain terminal of a series pass transistor, which has a source terminal at which is provided a programming voltage for an anti-fuse element; applying the program voltage to the drain terminal of a saturating transistor, which has a source terminal connected to the gate terminal of the series pass transistor; applying a voltage to the gate terminal of the saturating transistor to put the saturating transistor in a saturated mode; coupling an output voltage of an oscillator through a capacitor directly to the gate terminal of the series pass transistor; and turning on the series pass transistor on the peak of the output voltage of the oscillator to provide a programming voltage for the anti-fuse element.

BRIEF DESCRIPTION OF THE DRAWINGS

The accompanying drawings which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
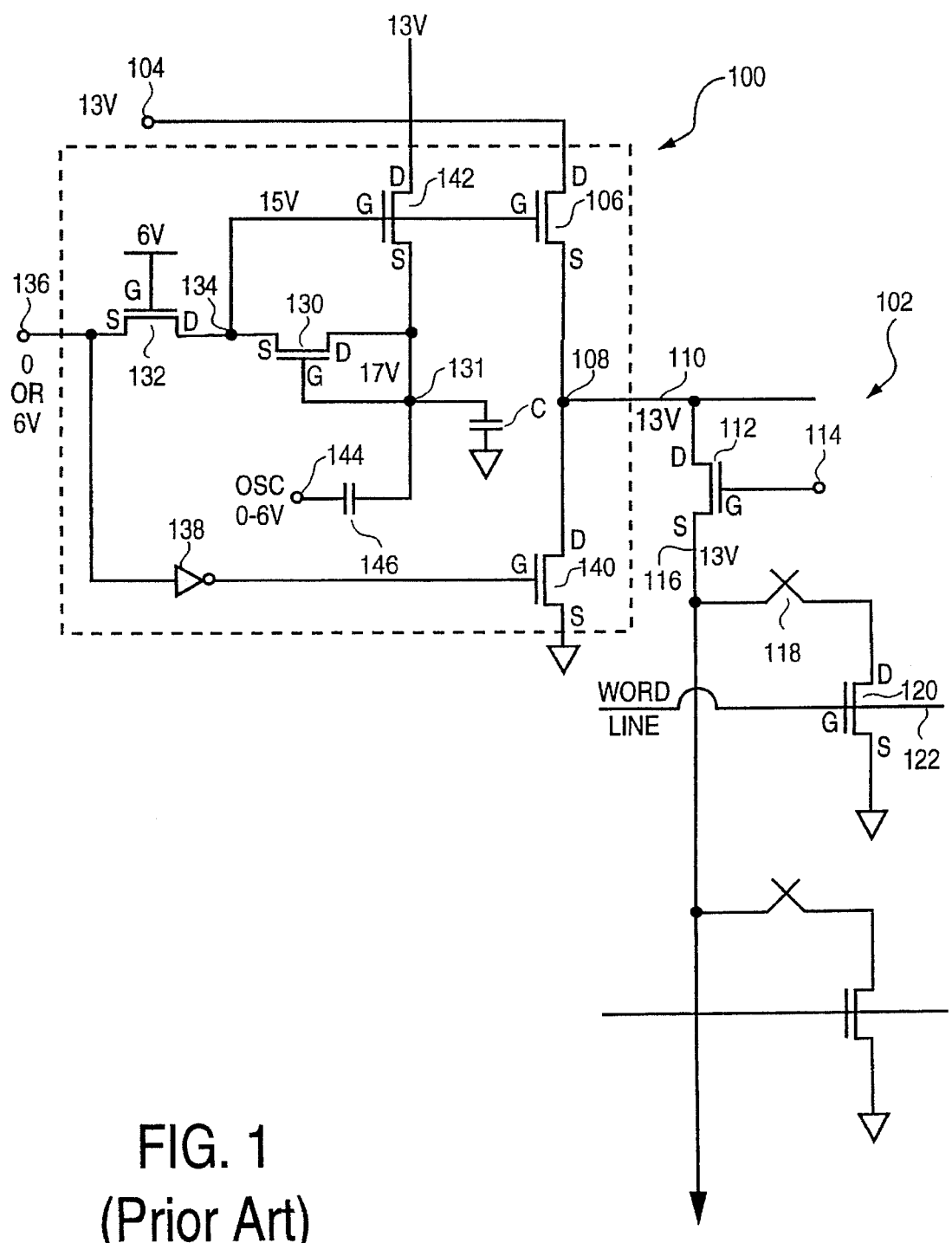
FIG. 1 is a circuit diagram of a prior-art anti-fuse ROM programming circuit for programming an anti-fuse link with a 13 volt programming voltage using a "charge-pump" circuit having a 17 volt internal voltage.

FIG. 1 shows a circuit diagram of a prior-art "charge-pump" programming circuit 100 for programming anti-fuse links in a memory array 102. Each anti-fuse link needs a minimum of 13 volts to be programmed. The programming circuit 100 includes a CO input terminal 104 at which is provided a 13 volt programming voltage. A series NMOS transistor 106 has its drain terminal connected to the CO input terminal 104. The source terminal of the NMOS transistor is connected to a programming HIGH VOLTAGE terminal 108 which is connected to the main high voltage programming line 110 of the memory array.

An NMOS column select transistor 112 has its drain terminal connected to the main high voltage line 110. The gate terminal 114 of the NMOS column select transistor 112 is connected to a 15 volt high voltage column address voltage to provide the 13 volt programming voltage to a column select line 116.

The memory device is composed of an array of columns and rows, or words, of memory cells, where each memory cell includes an anti-fuse element in one of two logic states, that is, in either a unprogrammed, high-resistance state or in a programmed, low-resistance state. The column, or bit, select line 116 has a number of anti-fuse elements, or links, connected thereto. An unprogrammed anti-fuse link has a resistance on the order of 1 gigohm, and a programmed anti-fuse link has a resistance on the order of 200 ohms. For programming a typical anti-fuse link 118, one terminal of the anti-fuse link is connected to the column select line 116 and the other terminal connected to the drain terminal of a word, or row, select transistor 120. The source terminal of the word select transistor 120 is connected to ground. The gate terminal of the word select transistor 120 is connected to a word line 122. To program the anti-fuse link 118, a 6 volt signal is applied to the word line 122. The other anti-fuse links of the memory array are similarly programmed by selection of a column and a row, or word.

The programming circuit 100 includes a "charge-pump" circuit which includes a diode-connected transistor 130 which has its gate and drain terminals connected together at an input terminal 131. Terminal 131 has an equivalent capacitance to ground C. The source terminal of the diode-connected transistor 130 and the drain terminal of a shunt transistor 132 are both connected to a biasing terminal 134. The gate terminal of the biasing transistor 132 is connected to a 6 volt supply.

The source terminal of the biasing transistor 132 is connected to a PROGRAM control terminal 136. A 0 volt signal that is applied to the PROGRAM control terminal 136 turns on the biasing transistor 132 to short the biasing terminal 134 to the 0 volt level. A 6 volt signal applied to the PROGRAM terminal 134 turns off the biasing transistor 132.

The PROGRAM control terminal 136 is also connected through an inverter 138 to the gate terminal of a shunt transistor 140, which has a source terminal connected to a ground voltage and which has a drain terminal connected to the HIGH VOLTAGE terminal 108. A 0 volt signal is applied to the PROGRAM control terminal 136 to turn on the shunt transistor 140 to short the PROGRAM control terminal 136 to ground when the charge pump circuit is inactive.

The biasing terminal 134 is also connected to the gate terminal of a voltage latching transistor 142, which has a source terminal connected to the source and gate terminals of the diode-connected transistor 130 at terminal 131. A drain terminal of the voltage latching transistor 142 is connected to a 13 volt supply.

In operation, the programming circuit 100 is activated by applying the 13 volt supply to the drain of the latching transistor 142. A 6 volt signal is applied to the PROGRAM terminal 136 to turn off the shunt transistor 132. An oscillator signal is applied to the input terminal 144 and through a capacitor 146 to the input terminal 131, which has an equivalent capacitance to ground C. The oscillator signal voltage at terminal 144 alternates between 0 and 6 volts. An initial 6 volt signal at terminal 144 provides a 6 volt signal at terminal 131 and traps a 4 volt signal at the biasing terminal 134. When the oscillator signal at terminal 144 goes to 0 volts, the trapped 4 volt signal at biasing terminal 134 causes the source terminal of the latch transistor 142 to be "latched" at 2 volts. Since the source terminal of the latch transistor 142 is connected to terminal 131, the voltage at terminal 131 remains latched at 2 volts when the oscillator signal at terminal 144 goes to 0 volts.

For the next cycle of the oscillator voltage at terminal 144, the input 6 volts is added to the 2 volts on terminal 131 to produce 8 volts on terminal 131 and a corresponding trapped 6 volts on terminal 134. When the oscillator voltage again goes to 0 volts, the trapped six volts on terminal 134 produces a latched 4 volts on terminal 131.

This process continues for each cycle of the oscillator voltage at terminal 144 until the trapped voltage on the biasing terminal 134 reaches 15 volts and the latched voltage on terminal 131 reaches 17 volts. At this point the series NMOS transistor 106 turns on to connect the 13 volts on the CO input terminal 104 to the programming HIGH VOLTAGE terminal 108. In actual operation a margin of 0.5 volt volts is used, so that the programming voltage needed is only 1.25 volts.

The circuit of FIG. 1 is used, for example, in a semiconductor process having a 1.0 micron feature size. Note that from the highest voltage point in the programming circuit, there is a 4.0 v drop to the top of the link to be programmed and the highest voltage is 17 volts. The breakdown voltage is also 17 volts.

For a fabrication process with a smaller feature size, such as 0.8 microns, the 0.8 micron process has a minimum junction breakdown of 16 v. This means that the voltage at the top of the anti-fuse link will be 12.0 v, which is less than the specification voltage for reliable programming of an anti-fuse link. This situation gets progressively worse because fabrication processes with even smaller feature sizes have even lower junction breakdown voltages. This squeeze between smaller feature sizes and the 4 volt differential required over the voltage at the programming HIGH VOLTAGE terminal 108 requires that an alternative to the "charge-pump" approach be used.

Figure 2:
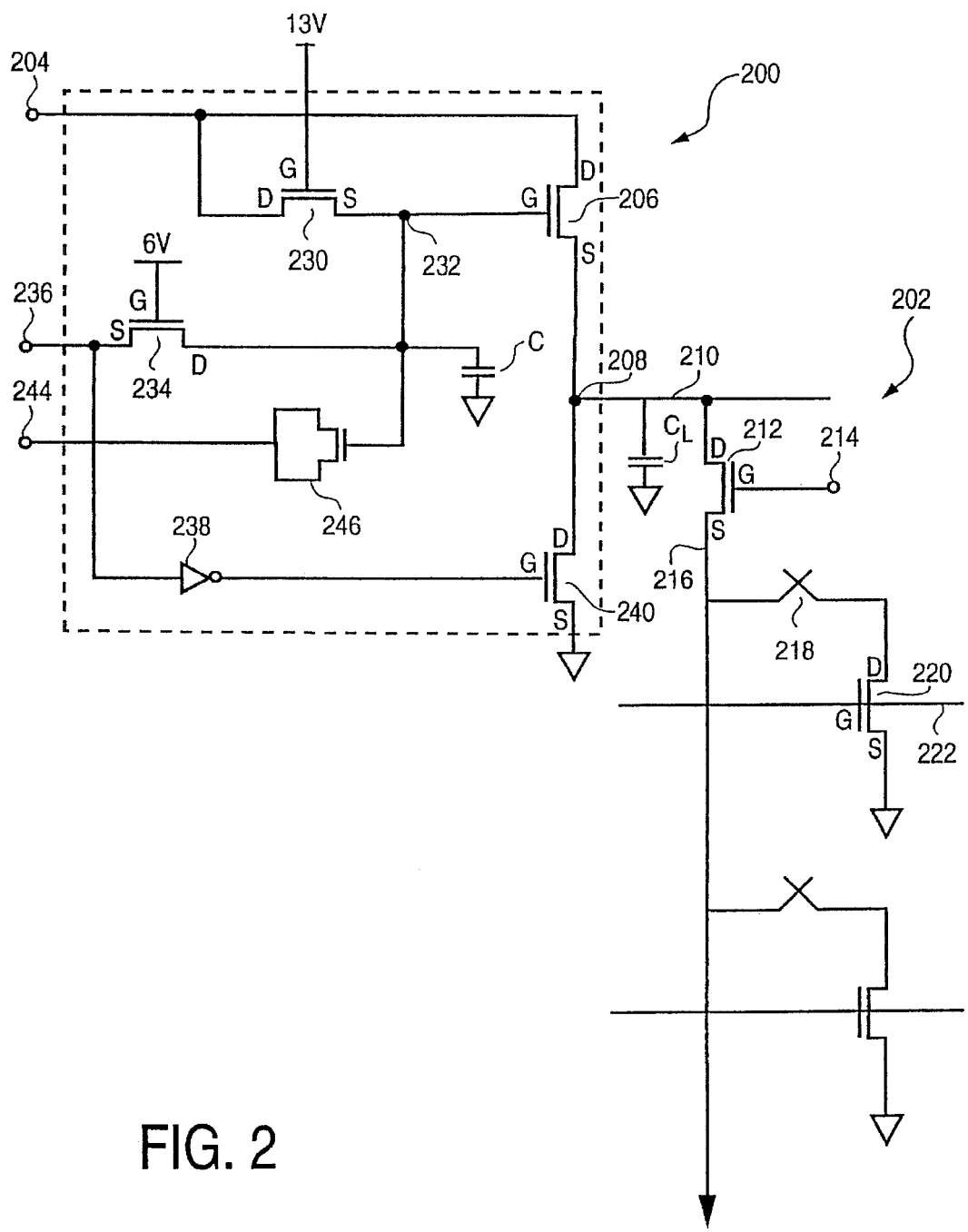
FIG. 2 is a circuit diagram of a "charge-kicker" circuit according to the invention for programming an anti-fuse link.

FIG. 2 is a circuit diagram of a "charge-kicker" programming circuit 200 according to the invention for programming anti-fuse links in integrated-circuit memory devices having smaller feature sizes and a correspondingly lower breakdown voltage but with lowered maximum internal voltage level to accommodate the .correspondingly lower breakdown voltage.

The anti-fuse links to be programmed are part of a memory array 202 which is similar to the memory array 102 of FIG. 1, described herein above. Each anti-fuse link needs a minimum of 13 volts to be programmed. The programming circuit 200 includes a CO input terminal 204 at which is provided a 13 volt programming voltage. A series NMOS transistor 206 has its drain terminal connected to the CO input terminal 204. The source terminal of the NMOS transistor is connected to a programming HIGH VOLTAGE terminal 208 which is connected to the main high voltage programming line 210 of the memory array 202.

An NMOS column select transistor 212 has its drain terminal connected to the main high voltage line 210. The gate terminal 214 of the NMOS column select transistor 212 is connected to a 15 volt high voltage column address voltage to provide the 13 volt programming voltage to a column select line 216.

The memory device is composed of an array of columns and rows, or words, of memory cells, where each memory cell includes an anti-fuse element in one of two logic states, that is, in either a unprogrammed, high-resistance state or in a programmed, low-resistance state. The column, or bit, select line 216 has a number of anti-fuse elements, or links, connected thereto. An unprogrammed anti-fuse link has a resistance on the order of 1 gigohm, and a programmed anti-fuse link has a resistance on the order of 200 ohms. For programming a typical anti-fuse link 218, one terminal of the anti-fuse link is connected to the column select line 216 and the other terminal connected to the drain terminal of a word, or row, select transistor 220. The source terminal of the word select transistor 220 is connected to ground. The gate terminal of the word select transistor 220 is connected to a word line 222. To program the anti-fuse link 218, a 6 volt signal is applied to the word line 222. The other anti-fuse links of the memory array are similarly programmed by selection of a column and a row, or word.

The programming circuit 200 includes a "charge-kicker" circuit which includes a saturating transistor 230 having a gate terminal connected to a 13 volt voltage reference and a drain terminal connected to the CO input terminal 204. The source terminal of the saturating transistor 230 is connected to a gating terminal 232, which is also connected to the gate terminal of the series NMOS transistor 206. Terminal 232 has an equivalent capacitance to ground C.

A first shunt transistor 234 has its drain terminal connected to the gating terminal 232. The gate terminal of the shunt transistor 234 is connected to a 6 volt supply. The source terminal of the shunt transistor 234 is connected to a PROGRAM control terminal 236. A 0 volt signal is applied to the PROGRAM control terminal 236 turns on the shunt transistor 234 to short the gating terminal 232 to the 0 volt level. A 6 volt signal applied to the PROGRAM terminal 236 turns off the shunt transistor 234.

The PROGRAM control terminal 236 is also connected through an inverter 238 to the gate terminal of a shunt transistor 240, which has a source terminal connected to a ground voltage and which has a drain terminal connected to the HIGH VOLTAGE terminal 208. A 0 volt signal is applied to the PROGRAM control terminal 236 to turn on the shunt transistor 240 to short the HIGH VOLTAGE terminal 208 to ground when the charge-kicker circuit is inactive.

In operation, the programming circuit 200 is activated by applying the 13 volt supply to the gate of the saturated transistor 230. The 13 volt CO from terminal 204 then goes through the saturated transistor 230. The gate of transistor 230 is at 13 volts so that the source terminal of transistor 230 is one threshold voltage plus body effect voltage down from the CO value of 13 volts. The DC voltage at the source terminal of transistor 230 and at the gating terminal 232 is then 10.72 volts.

An oscillator signal is applied to an input terminal 244 and through a capacitor-connected transistor 246 to the gating terminal 232, which has an equivalent capacitance C to ground. The oscillator signal voltage at terminal 244 alternates between 0 and 6 volts. A 6 volt signal at terminal 244 provides an additional 4.28 volt signal at terminal 232. The oscillator voltage rides on top of the 10.72 DC volts the gating terminal 232. Consequently the voltage at terminal 232 goes between 10.72 volts and 15 volts. The 15 volt signal is limited to that value to avoid voltage breakdown. This voltage at the gate terminal of the series NMOS transistor 206 allows the main high voltage line 210 to go to 13 v. The relatively high capacitance CL on line 210 holds the voltage on line 210 to 12.93 volts when the oscillator signal at terminal 244 goes to the 0 volt level.

One advantage of the charge-kicker circuit according to the invention is that a single cycle or two of the oscillator signal is sufficient to charge the line 210 to the 13 volt level required to guarantee programming of the anti-fuse elements.

Another advantage of the instant invention is that, instead of 17 volts being needed with a charge-pump to get 13 v on the main high voltage line, only 15 volts is needed according to the invention. The bit columns operate the same as described in connection with FIG. 1

The entire scheme can be used with other integrated-circuit processes having even smaller feature sizes in order to provide anti-fuse programming circuits which use lower internal voltages to avoid junction breakdown problems.

Figure 3A:
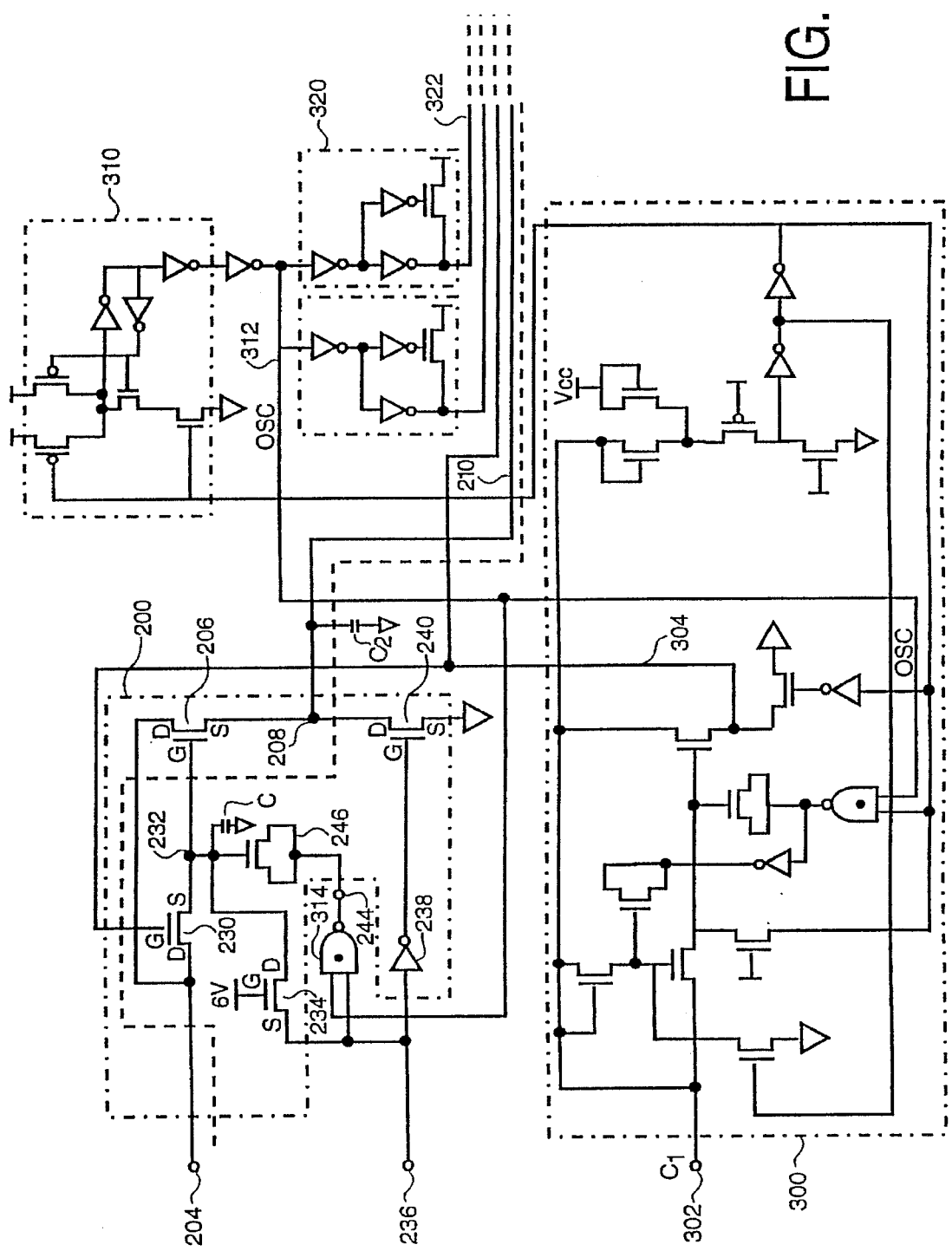
FIG. 3A & 3B shows additional circuits for implementation of the circuit of "the charge-kicker" circuit of FIG. 2.

FIG. 3 shows additional circuits for implementation of the "the charge-kicker" circuit 200 of FIG. 3A, where like reference numerals are used for similar circuit elements. A logic circuit 300 receives a 13 volt signal C1 at an input terminal 302 and provides a 13 volt signal on signal line 304 to the gate terminal of the saturated transistor 230 to activate the charge-kicker circuit 200. An oscillator circuit 310 provides an alternating output signal on line 312 which is connected through a NAND gate 314 to the input terminal 244 of the programming circuit 200.

The output signal of the oscillator is also amplified in an amplifier circuit 320 to drive a signal line 322 which is common to all of the column circuits of a memory device.

Figure 3B:
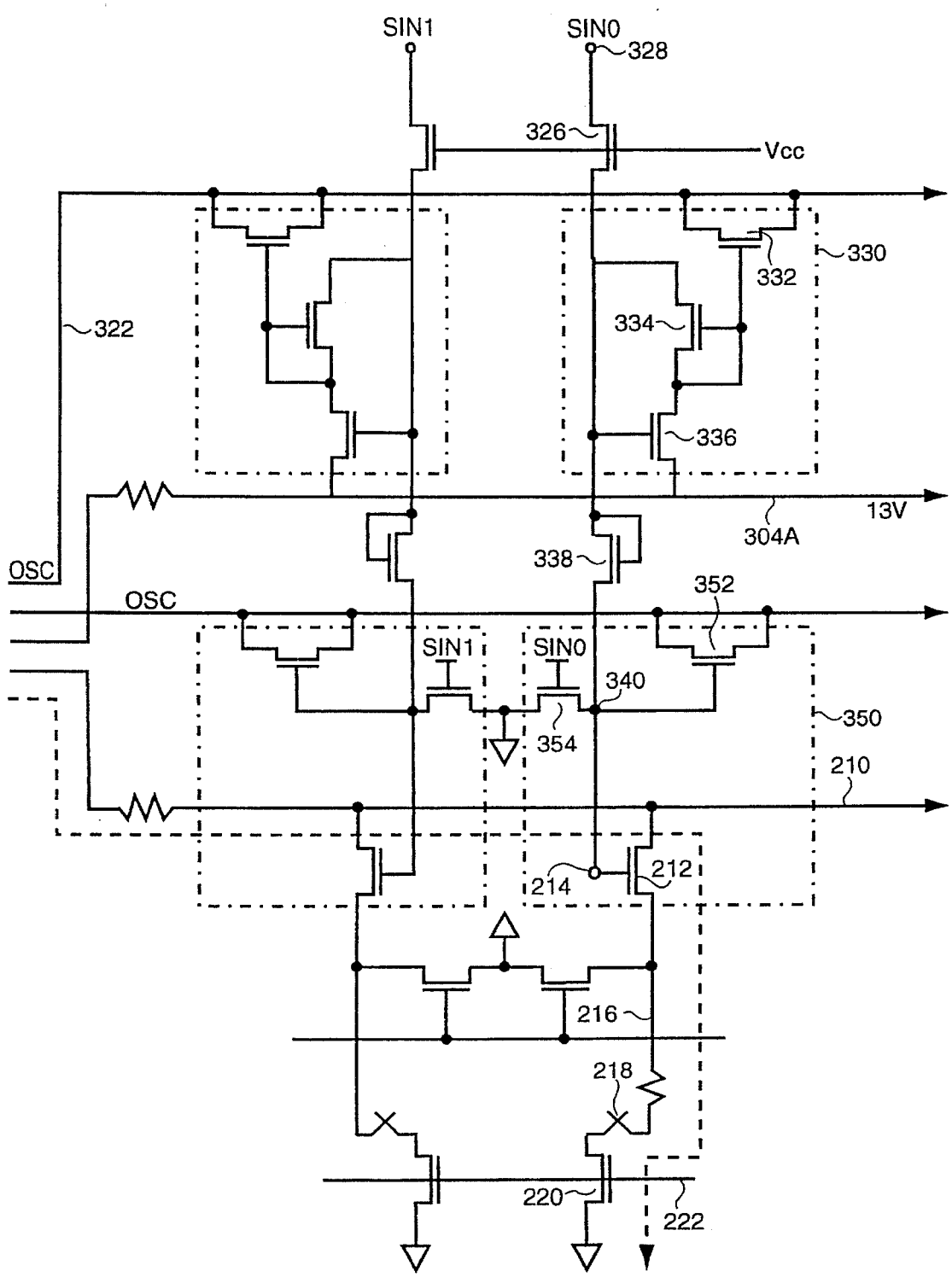

Selection of the anti-fuse 218 in FIG. 3B for programming is initiated by applying a 6 volt SIN0 signal from a column selection shift register to a terminal 328, which turns on a selection transistor 336 to apply a voltage to a charge pump circuit 330. The charge pump circuit 330 includes a transistor 332 connected as a coupling capacitor, a diode-connected transistor 334 and a transistor 336. A diode-connected transistor 338 traps charge on a terminal 340. Another charge kicker circuit 350 is formed with a transistor 352 connected as a coupling capacitor and a transistor 354 to provide a 15 volt signal at terminal 214 of the column select transistor 212. The column select transistor 212 applies the 13 volts on line 210 to the anti-fuse 218 when a signal on the word line 222 turns transistor 220 on.

The bit columns function as described previously. The signal that gates the transistor 212 has a saturated device 338 connected in series with the selection transistor 326. The purpose of the saturated device 338 is to isolate the action between the charge pump 330 and the kicker-pump 350. The saturated device 338 acts as a diode to transfer a high voltage charge from charge pump 330 to the charge-kicker 350 which provides a voltage for turning on the column select transistor 212. The charge-kicker 350 pushes the gate of the column select transistor 212 close to 15 volts which gates the high voltage programming voltage to the top of the anti-fuse link 218. When the address shifts to another bit column, the source of the series saturated device has to be discharged, and this is the purpose of the two devices gated by the inverted SIN0 and SIN 1 signals.

The foregoing descriptions of specific embodiments of the present invention have been presented for the purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. An on-chip programming circuit for programming anti-fuse elements of an integrated-circuit ROM, comprising:

a series pass transistor for directing a high voltage programming voltage to a high-voltage programming line for anti-fuse elements;

means for providing a fixed voltage to the gate terminal of the series pass transistor, wherein the fixed voltage is insufficient to turn on the series pass transistor;

means for directly superimposing an alternating voltage directly onto the gate terminal of the series pass transistor wherein the peaks of the alternating voltage superimposed on the gate terminal of the series pass transistor turn on the series pass transistor to apply the programming voltage to the main high voltage programming line of an anti-fuse memory array;

wherein the means for directly superimposing an alternating voltage directly onto the gate terminal of the series pass transistor includes a capacitor having one terminal connected to the gate terminal of the series pass transistor and having another terminal connected to an alternating voltage source.

2. The on-chip programming circuit of claim 1 wherein the means for providing a fixed voltage to the gate terminal of the series pass transistor includes a saturating transistor having a drain terminal connected to the high voltage programming voltage, having a source terminal connected to the gate terminal of the series pass transistor, and having a gate terminal connected to a voltage sufficient to saturate the saturating transistor.

3. The on-chip programming circuit of claim 1 including means for shorting the gate terminal of the series pass transistor to a ground voltage.

4. The on-chip programming circuit of claim 1 including means for shorting the source terminal of the series pass transistor to a ground voltage.

5. An on-chip programming circuit for programming anti-fuse elements of an integrated-circuit ROM, comprising:

an input terminal for the programming circuit at which is provided a programming voltage;

an output terminal of the programming circuit;

a first series transistor having a drain terminal connected to the input terminal of the programming circuit and having a source terminal connected to the output terminal of the programming circuit;

a saturated transistor having a drain terminal connected to the input terminal of the programming circuit, having a source terminal connected to the gate terminal of the first series transistor, and having a gate terminal to which is applied a positive voltage source so that the second saturated transistor remains in the saturated mode of operation;

an oscillator input terminal;

a series capacitor having a first terminal connected to the oscillator input terminal and a second terminal connected to the gate terminal of the series transistor;

an oscillator circuit connected to the oscillator input terminal and providing an alternating voltage signal through the series capacitor directly to the gate terminal of the first series transistor, where the oscillator provides a peak voltage sufficient to turn on the first series transistor so that the programming voltage is applied to the output terminal of the circuit voltage during the positive peaks of the oscillator voltage.

6. The programming circuit of claim 5 wherein the programming voltage is 13 volts.

7. The programming circuit of claim 6 wherein the output alternating voltage of the oscillator circuit is 6 volts peak.

8. The programming circuit of claim 5 including a first shunt transistor having a source terminal, a drain terminal, and a gate terminal, wherein the drain terminal is connected to the output terminal of the circuit, wherein the source terminal is connected to a ground potential; and wherein the gate terminal is connected to a first logic signal which goes HIGH to turn on the first shunt transistor and shunt the output terminal of the circuit to the ground potential.

9. The programming circuit of claim 5 including a second shunt transistor having a source terminal, a drain terminal, and a gate terminal, wherein the drain terminal is connected to the gate terminal of the first series transistor, wherein the gate terminal is connected to a positive voltage; and wherein the source terminal is connected to a logic terminal which has a signal logic signal applied thereto for disabling the first series transistor.

10. The programming circuit of claim 5 including selection means for connecting an anti-fuse element to be programmed to the output terminal of the programming circuit to provide the programming voltage to the anti-fuse element.

11. The programming circuit of claim 5 including means for activating the programming circuit by applying a positive voltage signal to the gate terminal of the saturated transistor.

12. The programming circuit of claim 11 wherein the means for activating the programming circuit by applying a positive voltage signal to the gate terminal of the second saturated transistor includes means for starting the oscillator circuit.

13. The programming circuit of claim 5 including a column select transistor having a drain terminal connected to the output terminal of the programming circuit, having a source terminal connected to an anti-fuse link, and a gate terminal connected to a 15 volt high voltage column address voltage to provide a 13 volt programming voltage to the anti-fuse link through the column select transistor.

14. A method for programming anti-fuse elements of an anti-fuse ROM, comprising the steps of:

applying a programming voltage to the drain terminal of a series pass transistor, which has a source terminal at which is provided a programming voltage for an anti-fuse element;

applying the program voltage to the drain terminal of a saturating transistor, which has a source terminal connected to the gate terminal of the series pass transistor;

applying a voltage to the gate terminal of the saturating transistor to put the saturating transistor in a saturated mode;

coupling an output voltage of an oscillator through a capacitor directly to the gate terminal of the series pass transistor;

turning on the series pass transistor on the peak of the output voltage of the oscillator to provide a programming voltage for the anti-fuse element.

15. The method of claim 9 including the step of gating the programming voltage to the anti-fuse device through a switching transistor.

\* \* \* \* \*